(12) United States Patent
Oh

(10) Patent No.: US 11,468,801 B2
(45) Date of Patent: Oct. 11, 2022

(54) DISPLAY DEVICE

(71) Applicant: LG Display Co., Ltd., Seoul (KR)

(72) Inventor: Yeonjun Oh, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 172 days.

(21) Appl. No.: 17/081,300

(22) Filed: Oct. 27, 2020

(65) Prior Publication Data
US 2021/0142698 A1    May 13, 2021

(30) Foreign Application Priority Data
Nov. 11, 2019    (KR) .................... 10-2019-0143223

(51) Int. Cl.
*G09F 9/30* (2006.01)
*H01L 51/52* (2006.01)

(52) U.S. Cl.
CPC ............ *G09F 9/301* (2013.01); *H01L 51/524* (2013.01); *H01L 51/5293* (2013.01)

(58) Field of Classification Search
CPC ..................................................... G09F 9/301
See application file for complete search history.

(56) References Cited

FOREIGN PATENT DOCUMENTS

| CN | 105869522 A | 8/2016 |
|---|---|---|
| CN | 107342018 A | 11/2017 |
| CN | 107993574 A | 5/2018 |
| CN | 109377885 A | 2/2019 |
| CN | 109872639 A | 6/2019 |
| CN | 110335546 A | 10/2019 |
| KR | 10-1888844 B1 | 9/2018 |

OTHER PUBLICATIONS

China Office Action dated May 18, 2022 issued in Patent Application No. 202011108006.2 w/English Translation (17 pages).

*Primary Examiner* — Vip Patel
(74) *Attorney, Agent, or Firm* — Polsinelli PC

(57) ABSTRACT

A display device includes a display panel; a back cover disposed on a rear surface of the display panel to support the display panel; a roller disposed on a rear surface of the back cover, wherein the display panel and the back cover are wound around or unwound from the roller; a support bar disposed on a front surface of the display panel and fastened to the display panel and the back cover through fastening means; and at least one anti-shift means disposed on the rear surface of the back cover and fastened to a fastening groove of the roller when the display panel and the back cover are wound around the roller. Accordingly, it is possible to prevent cracks in the pad area and damages to the flexible film, thereby solving the issues of driving failure and reliability of the display panel.

20 Claims, 13 Drawing Sheets

DISPLAY DEVICE

CROSS-REFERENCE TO RELATED APPLICATION

This application claims the priority to Korean Patent Application No. 10-2019-0143223 filed on Nov. 11, 2019, which is hereby incorporated by reference in its entirety.

BACKGROUND

Field of the Disclosure

The present disclosure relates to a display device, and more particularly to a rollable display device that can display images even when it is rolled.

Description of the Background

Display devices employed by the monitor of a computer, a TV, a mobile phone or the like include an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger display area with reduced volume and weight.

In addition, a rollable display device is attracting attention as the next generation display device. Such a rollable display device is fabricated by forming display elements and lines on a flexible substrate made of a flexible material such as plastic so that it is able to display images even if it is rolled.

SUMMARY

Accordingly, the present disclosure is to provide a rollable display device employing a polyimide (PI) substrate that can reduce the shift phenomenon between a display panel and a mechanism and can reduce stress applied to a flexible film.

The present disclosure is not limited to the above-mentioned objects, and other objects, which are not mentioned above, can be clearly understood by those skilled in the art from the following descriptions.

According to an aspect of the present disclosure, there is provided a display device including: a display panel; a back cover disposed on a rear surface of the display panel to support the display panel; a roller disposed on a rear surface of the back cover, wherein the display panel and the back cover are wound around or unwound from the roller; a support bar disposed on a front surface of the display panel and fastened to the display panel and the back cover through fastening means; and at least one anti-shift means disposed on the rear surface of the back cover and fastened to a fastening groove of the roller when the display panel and the back cover are wound around the roller.

According to another aspect of the present disclosure, there is provided a display device including: a display panel; a back cover disposed on a rear surface of the display panel to support the display panel; a roller disposed on a rear surface of the back cover, wherein the display panel and the back cover are wound around or unwound from the roller; and a support bar disposed on a front surface of the display panel and fastened to the display panel and the back cover through fastening means, wherein the display panel comprises a substrate divided into a display area and a non-display area; a first anti-crack layer disposed below the substrate in the non-display area; and a second anti-crack layer disposed above the substrate in the non-display area, and wherein the support bar is disposed over the first anti-crack layer.

Other detailed matters of the exemplary aspects are included in the detailed description and the drawings.

According to an exemplary aspect of the present disclosure, it is possible to reduce cracks in a pad area and damage to a flexible film which may occur in a rollable display device employing a polyimide (PI) substrate.

In this manner, it is possible to solve issues of driving failure and reliability of a display panel.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain various principles.

In the drawings.

DETAILED DESCRIPTION

Figure 1A:
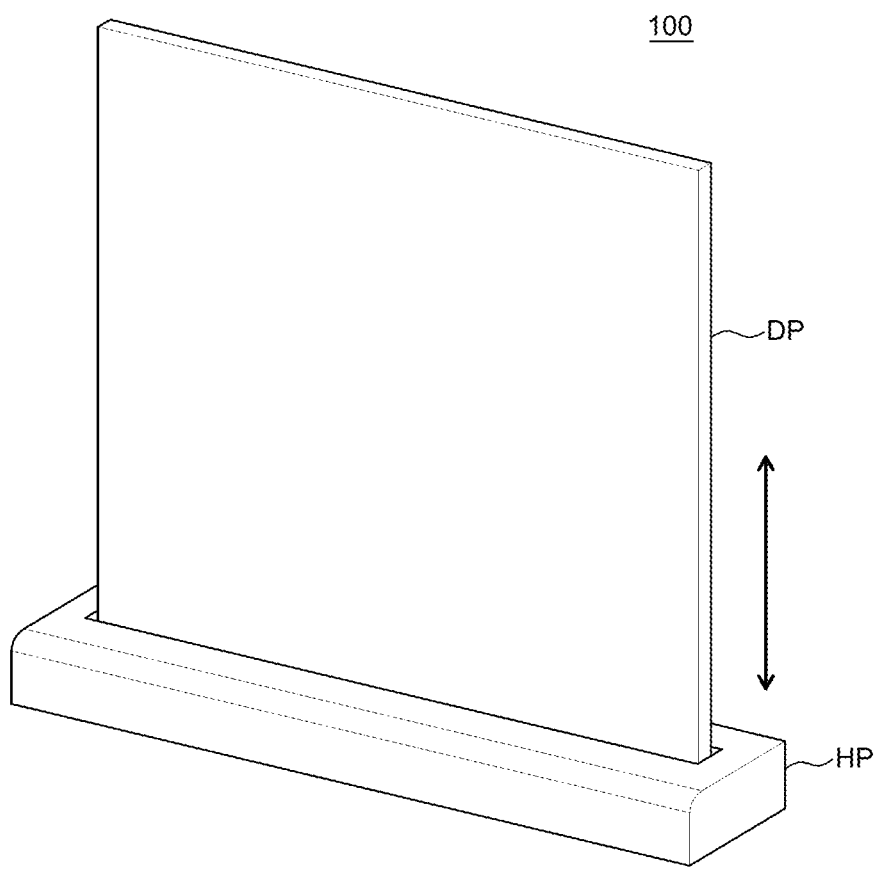
FIGS. 1A and 1B are perspective views of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly disposed on another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

A rollable display device may be referred to as a display device capable of displaying images even when it is rolled. A rollable display device may have higher flexibility than existing typical display devices. Depending on whether a rollable display device is in use or not, the shape of the rollable display device may be changed as desired. Specifically, when the rollable display device is not used, the rollable display device may be rolled to reduce the volume for storage. On the other hand, when the rollable display device is used, the rolled rollable display device may be unfolded for use.

Figure 1B:
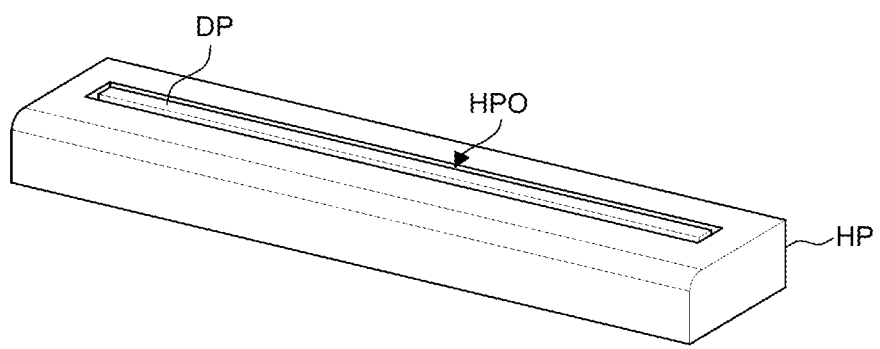

FIGS. 1A and 1B are perspective views of a display device according to an exemplary aspect of the present disclosure. Referring to FIGS. 1A and 1B, a display device 100 according to an exemplary aspect of the present disclosure may include a display part DP and a housing part HP.

The display part DP is an element for displaying images to a user. For example, a display element, circuitry for driving the display element, lines and components may be disposed in the display part DP.

Since the display device 100 according to an exemplary aspect of the present disclosure is a rollable display device, the display part DP may be able to be wound or unwound. The display part DP may be formed of a display panel and a back cover having flexibility to be able to be wound or unwound. The display part DP will be described in more detail later with reference to FIGS. 4 to 7.

The housing part HP is a case in which the display part DP can be accommodated. The display part DP may be wound and accommodated inside the housing part HP, and the display part DP may be unwound and disposed outside the housing part HP.

The housing part HP has an opening HPO so that the display part DP can move inside and outside the housing part HP. The display part DP may move in the vertical direction through the opening HPO of the housing part HP.

In addition, the display part DP may be switched between a full-unwinding state and a full-winding state.

FIG. 1A shows the fully-unwinding state of the display part DP of the display device 100, in which the display part DP of the display device 100 is disposed outside the housing part HP. That is to say, in order for a user to watch images on the display device 100, the display part DP is fully unwound until it can no longer be unwound and disposed outside the housing part HP.

FIG. 1B shows the fully-winding state of the display part DP of the display device 100, in which the display part DP of the display device 100 is disposed inside the housing part HP until it can no longer be wound. That is to say, when the user does not watch images on the display device 100, it is advantageous in terms of appearance that the display part DP is not disposed outside the housing part HP. Therefore, the display part DP is wound and is accommodated inside the housing part HP, which may be defined as the fully wound state. In addition, when the display part DP is in the fully-winding state where it is accommodated in the housing part HP, the volume of the display device 100 can be reduced and thus it is easier to carry.

A driver is disposed for winding or unwinding the display part DP to switch between the fully-unwinding state and the fully-winding state.

Figure 2:
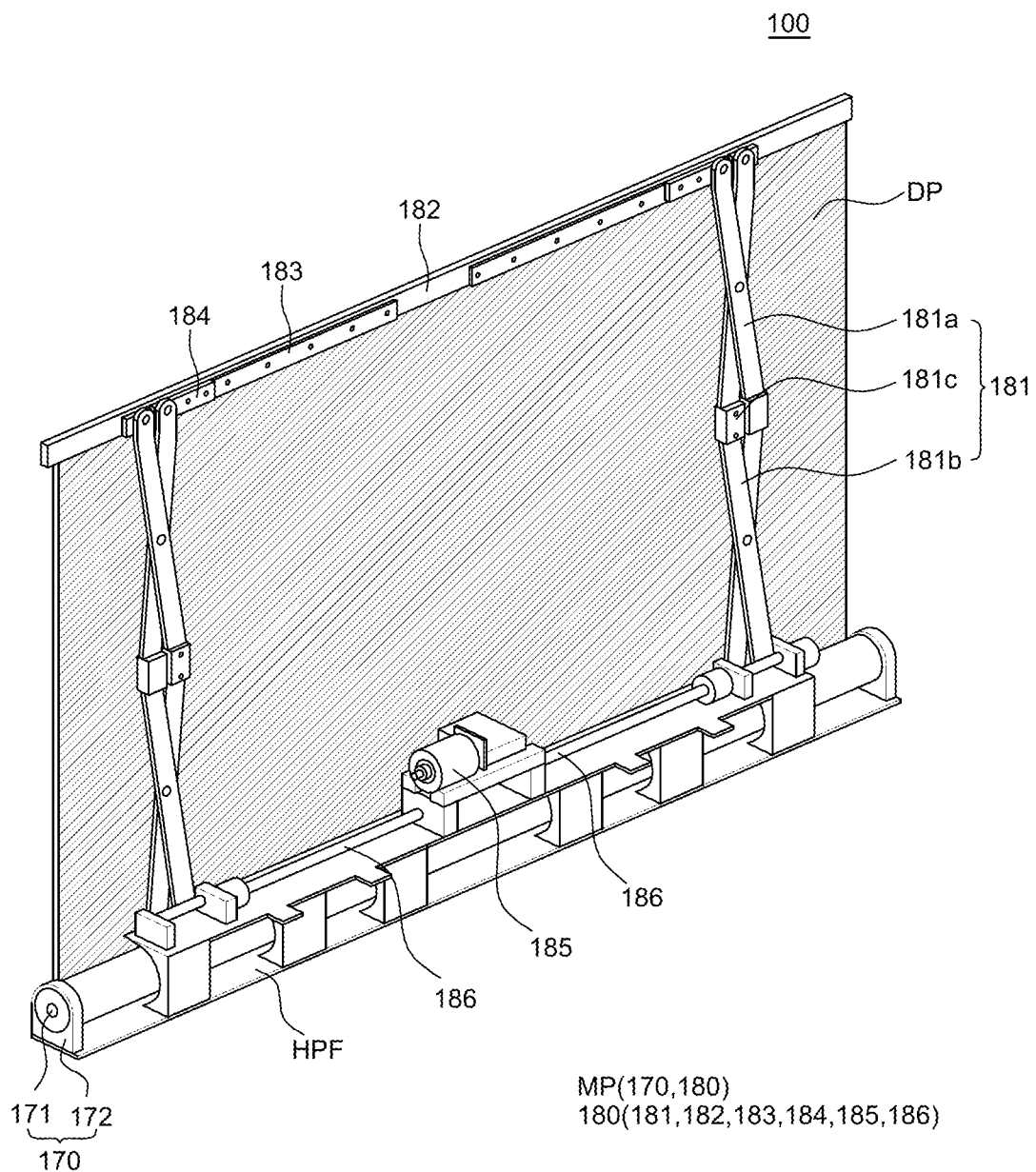
FIG. 2 is a perspective view of a display device according to an exemplary aspect of the present disclosure.

FIG. 2 is a perspective view of a display device according to an exemplary aspect of the present disclosure.

Figure 3:
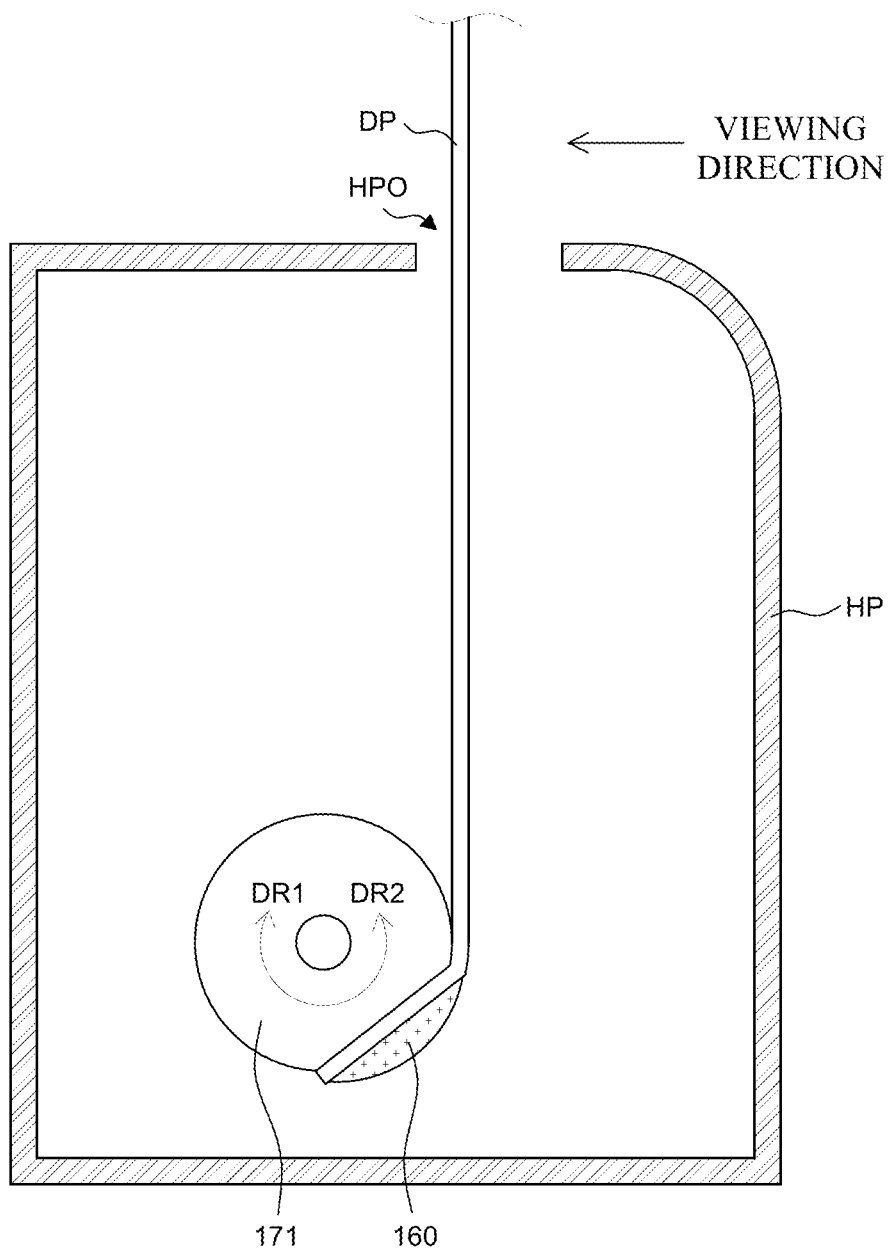
FIG. 3 is a schematic cross-sectional view of a display device according to an exemplary aspect of the present disclosure.

FIG. 3 is a schematic cross-sectional view of a display device according to an exemplary aspect of the present disclosure.

FIG. 3 is a schematic cross-sectional view for illustrating a roller 171 and a display part DP of a display device 100 according to an exemplary aspect of the present disclosure. Accordingly, for convenience of illustration, FIG. 3 shows only the housing part HP, the roller 171 and the display part DP.

Referring to FIG. 2, the driver MP may include a roller unit 170 and an elevation mechanism 180.

The roller unit 170 may rotate clockwise or counterclockwise while the display part DP fixed to the roller unit 170 may be wound around or unwound from it. The roller unit 170 may include a roller 171 and roller supports 172.

The roller 171 is a member around which the display part DP is wound. The roller 171 may be formed in a cylindrical shape, for example. The lower edge of the display part DP may be fixed to the roller 171. When the roller 171 rotates, the display part DP having its lower edge fixed to the roller 171 may be wound around the roller 171. When the roller 171 rotates in the opposite direction, the display part DP wound around the roller 171 may be unwound from the roller 171.

Referring to FIG. 3, the roller 171 may be formed in a cylindrical shape. A part of the outer circumferential surface of the cylindrical shape may be formed as a flat surface, and the rest part of the outer circumferential surface of the cylindrical shape may be formed as a curved surface. The roller 171 may be formed generally in a cylindrical shape, with a part of it formed as a flat surface. That is to say, a part of the outer circumferential surface of the roller 171 may be formed flat while the rest part of the outer circumferential surface thereof may be formed curved.

The printed circuit board 135 (see FIG. 4) of the display part DP may be seated on the flat part of the roller 171. It is, however, to be noted that the roller 171 may be formed in a complete cylindrical shape or in any shape as long as the display part DP can be wound around it.

The printed circuit board may be mounted in the flat part of the roller 171. Specifically, at least one accommodating groove is formed inside the flat part of the roller 171, and the printed circuit board of the display part DP is inserted into and seated in the accommodating groove. The number of the accommodating grooves may be equal to the number of printed circuit boards.

A support bar 160 according to the exemplary aspect of the present disclosure may be fastened to the opposite surface to the surface of the display part DP where the flat part of the roller 171 is in contact with and fastened to. The support bar may be disposed on a front surface of the display panel 120 that is opposite to the back cover 110.

As the support bar 160 is fastened to the display part DP through the fastening means such as a bolt, it is possible to suppress the shift phenomenon between the display panel and the mechanism. A more detailed description thereon will be given later.

Referring back to FIG. 2, the roller supports 172 may support the roller 171 on both sides of the roller 171. Specifically, the roller supports 172 are disposed on the floor HPF of the housing part HP, and the upper side surface of the roller supports 172 may be combined with both ends of the roller 171, respectively. Thus, the roller supports 172 may support the roller 171 so that they are spaced apart from the floor HPF of the housing part HP. The roller 171 may be coupled to the roller supports 172 so that it can rotate.

The elevation mechanism 180 may move the display part DP in the vertical direction in accordance with the driving of the roller unit 170. The elevation mechanism 180 may include link units 181, a head bar 182, slide rails 183, sliders 184, a motor 185, and rotors 186.

Each of the link units 181 of the elevation mechanism 180 may include a plurality of links 181a and 181b and a hinge 181c connecting between the links 181a and 181b. Specifically, the plurality of link 181a and 181b may include a first link 181a and a second link 181b, and the first link 181a and the second link 181b cross each other in a scissor shape and are rotatably connected via the hinge 181c. Accordingly, when the link unit 181 moves in the vertical direction, the links 181a and 181b may rotate in a direction that is moved away from or closer to each other.

The head bar 182 of the elevation mechanism 180 may be fixed to the top end of the display part DP. The head bar 182 may be connected to the link unit 181 and may move the display part DP in the vertical direction according to the rotation of the plurality of links 181a and 181b of the link unit 181. In other words, the display part DP may be moved in the vertical direction by the head bar 182 and the link unit 181.

The head bar 182 covers only a part of the surface adjacent to the top edge of the display part DP so as not to hide the images displayed on front face of the display part DP. The display part DP and the head bar 182 may be fixed with, but is not limited to, screws.

The slide rails 183 of the elevation mechanism 180 may provide movement paths of the plurality of links 181a and 181b. A part of the links 181a and 181b is rotatably fastened to the slide rails 183, so that movement can be guided along the trajectory of the slide rails 183. A part of the links 181a and 181b may be fastened to the sliders 184 that are movable along the slide rails 183, so that they can move along the trajectory of the slide rails 183.

The motor 185 may be connected to a power generator such as a separate external power supply or a built-in battery to receive power. The motor 185 may generate a rotational force to provide a driving force to the rotors 186.

The rotors 186 are connected to the motor 185 and are configured to convert rotational motion from the motor 185 into linear reciprocating motion. That is to say, the rotational motion of the motor 185 can be converted into a linear reciprocating motion of the structure fixed to the rotors 186. For example, the rotors 186 may be implemented as, but is not limited to, a shaft and a ball screw including a nut fastened to the shaft.

The motor 185 and the rotors 186 may be interlocked with the link units 181 to elevate the display part DP. The link units 181 are formed in a link structure and receive the driving force from the motor 185 and the rotors 186 to repeatedly perform folding or unfolding operations.

When the display part DP is wound, the motor 185 is driven, and accordingly the structure of the rotors 186 may perform a linear motion. That is to say, a part of the rotors 186 to which one end of the second link 181b is connected may perform linear motion. As a result, one end of the second link 181b may move toward the motor 185, and the plurality of links 181a and 181b may be folded, so that the height of the link units 181 may be reduced. In addition, in the course that the links 181a and 181b are folded, the head bar 182 connected to the first link 181a also descends, and one end of the display part DP connected to the head bar 182 also descends.

When the display part DP is unwound, the motor 185 is driven, and accordingly the structure of the rotors 186 may perform a linear motion. That is to say, a part of the rotors 186 to which one end of the second link 181b is connected may perform linear motion. Accordingly, one end of the second link 181b may move away from the motor 185, and the plurality of links 181a and 181b may be unfolded, so that the height of the link units 181 may be increased. In addition, in the course that the links 181a and 181b are unfolded, the head bar 182 connected to the first link 181a also ascends, and one end of the display part DP connected to the head bar 182 also ascends.

Accordingly, when the display part DP is fully wound around the roller 171, the link units 181 of the elevation mechanism 180 may remain folded. That is to say, when the display part DP is fully wound around the roller 171, the elevation mechanism 180 may have the lowest height. When the display part DP is fully unwound, the link units 181 of the elevation mechanism 180 may remain unfolded. That is to say, when the display unit DP is fully unwound, the elevation mechanism 180 may have the highest height.

When the display part DP is wound, the roller 171 may rotate and the display part DP may be wound around the roller 171. Referring to FIG. 3 as an example, the lower edge of the display part DP may be connected to the roller 171. When the roller 171 rotates in a second direction DR2, i.e., counterclockwise, the rear surface of the display part DP may be in tight contact with the surface of the roller 171 so that the display part DP can be wound around it.

On the other hand, when the display part DP is unwound, the roller 171 may rotate and the display part DP may be unwound from the roller 171. For example, referring to FIG. 3, when the roller 171 rotates in the first direction DR1, i.e., clockwise, the display part DP wound around the roller 171 may be unwound from the roller 171 and may be disposed outside the housing part HP.

In some other exemplary aspects, the driver MP having other structure than that of the above-described driver MP may be employed by the display device 100. The configurations of the roller unit 170 and the elevation mechanism 180 may be altered, some of the configurations may be omitted or other configurations may be added, as long as the display part DP can be wound and unwound.

Figure 4:
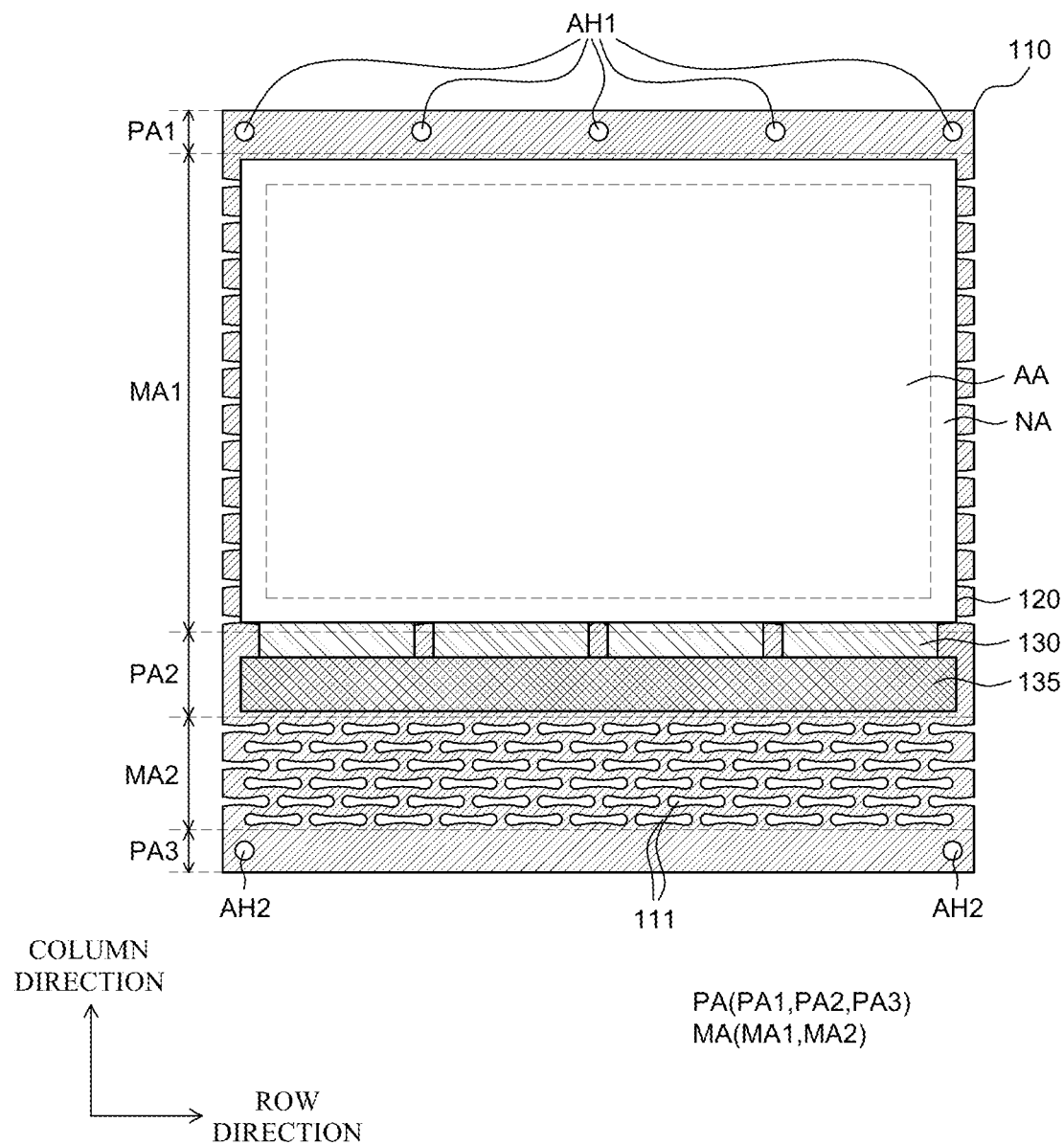
FIG. 4 is a plan view of a display part of a display device according to an exemplary aspect of the present disclosure.

FIG. 4 is a plan view of a display part of a display device according to an exemplary aspect of the present disclosure.

Figure 5A:
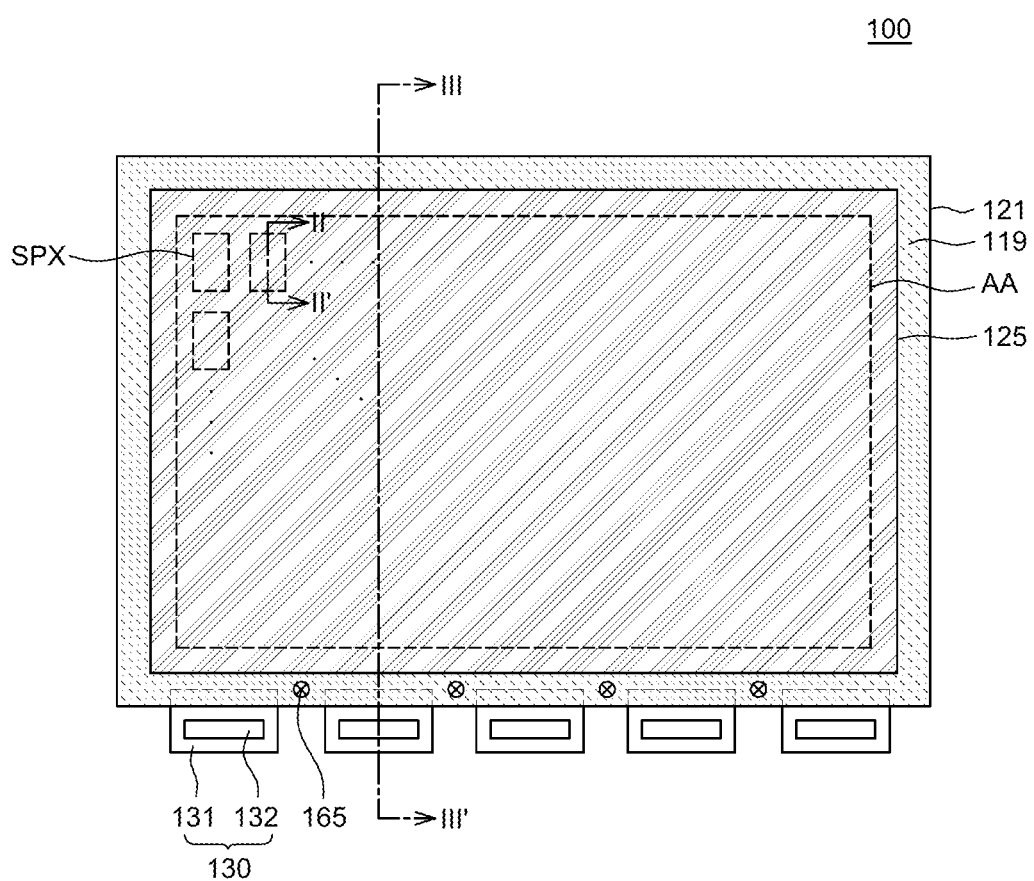
FIGS. 5A and 5B are plan views of a display device according to an exemplary aspect of the present disclosure.
Figure 5B:
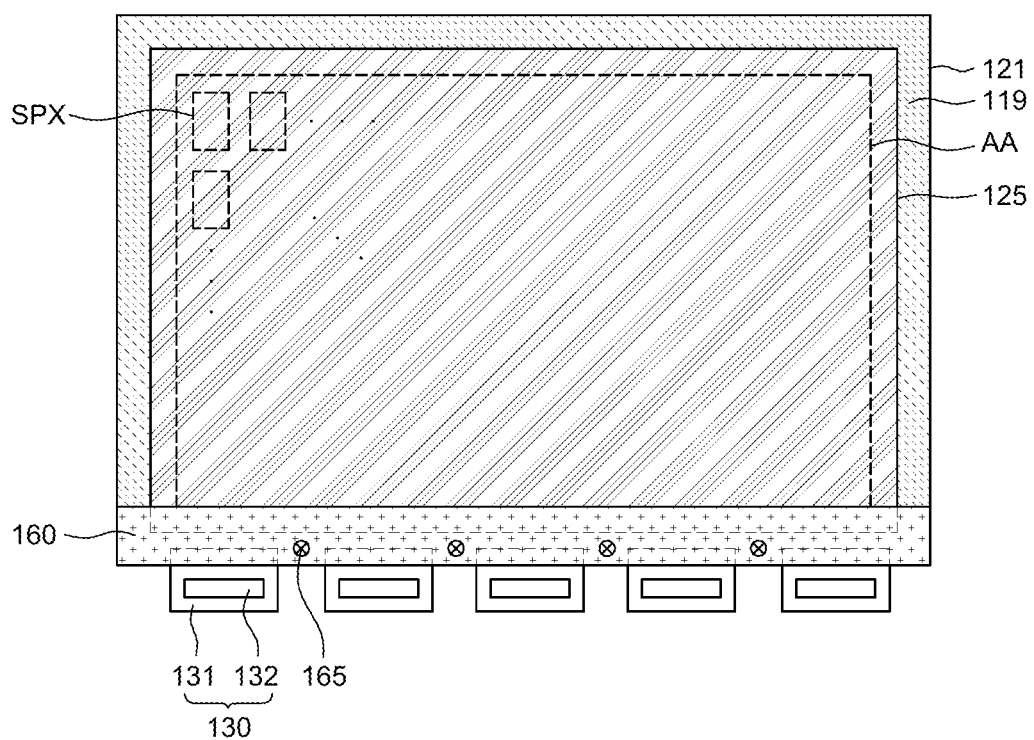

FIGS. 5A and 5B are plan views of a display device according to an exemplary aspect of the present disclosure.

Figure 6:
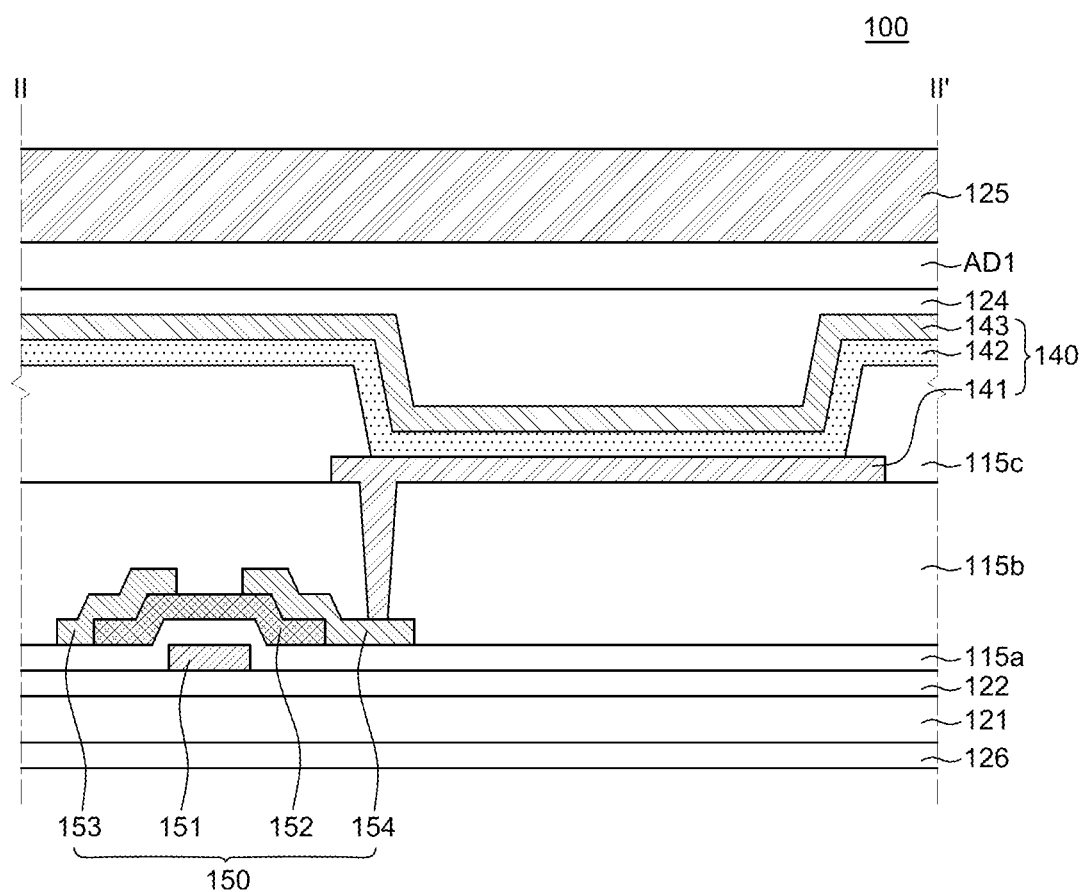
FIG. 6 is a cross-sectional view taken along line II-II' of FIG. 5A.

FIG. 6 is a cross-sectional view taken along line II-II' of FIG. 5A.

Figure 7:
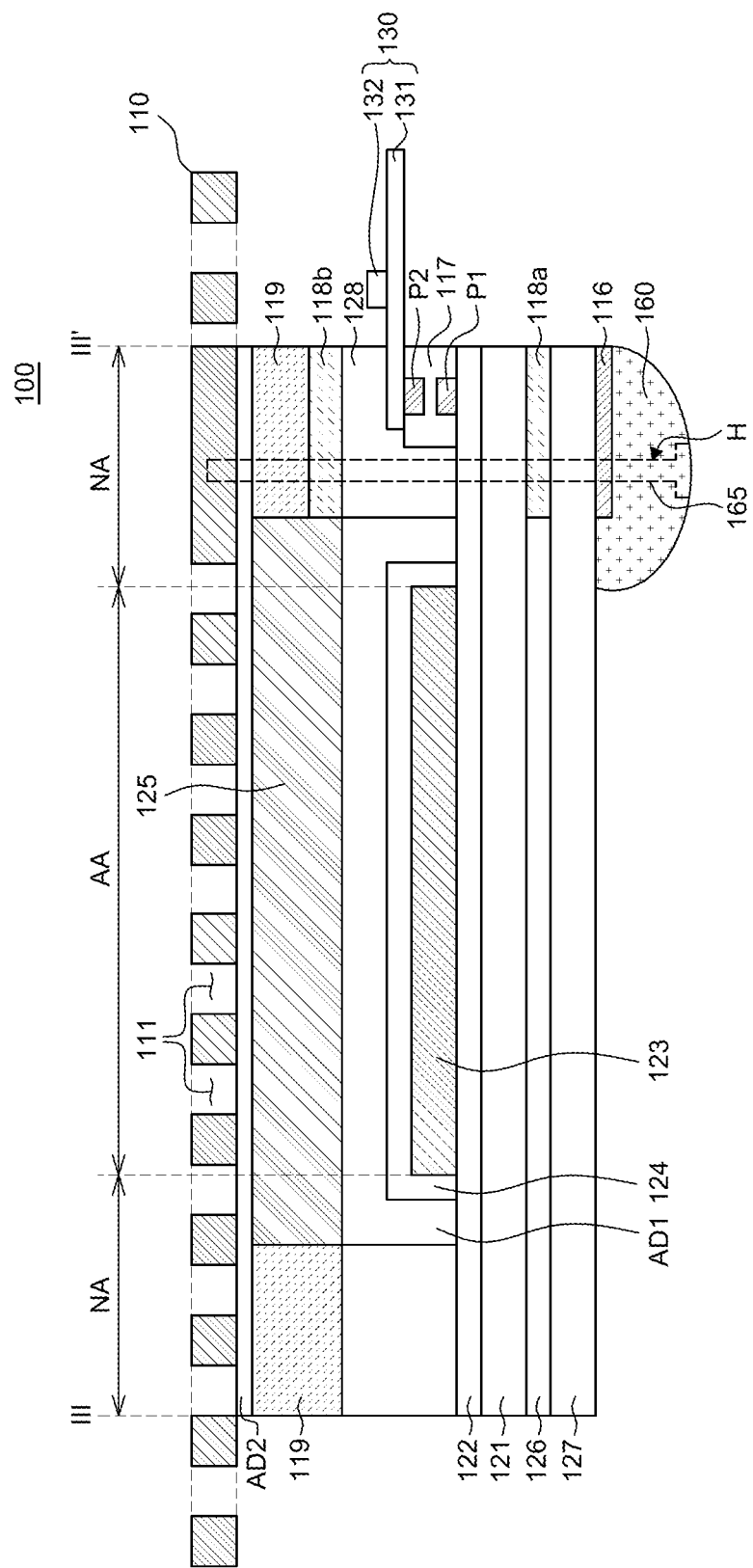
FIG. 7 is a cross-sectional view taken along line III-III' of FIG. 5A.

FIG. 7 is a cross-sectional view taken along line III-III' of FIG. 5A.

FIG. 5A shows the flexible film 130 fastened to the display panel 120. FIG. 5B shows the support bar 160 fastened to the display panel 120 to which the flexible film 130 is fastened through the fastening means 165.

For convenience of illustration, FIGS. 5A and 5B show only a substrate 121, an encapsulation substrate 125, at least one flexible film 130 and a sealing layer 119 among various elements of the display device 100. FIG. 7 schematically shows the display part DP. In the following description, the display device 100 according to the exemplary aspect of the present disclosure has a bottom-emission structure.

Referring to FIGS. 4 to 7, the display part DP may include a back cover 110, the display panel 120, the flexible film 130, and the printed circuit board 135.

Referring to FIG. 4, the back cover 110 may be disposed on the rear surface of the display panel 120 to support the display panel 120, at least one flexible film 130 and the printed circuit board 135. The back cover 110 may be larger than the display panel 120. The back cover 110 can protect other elements of the display part DP from the outside.

Although the back cover 110 is made of a material having rigidity, at least a part of the back cover 110 may have flexibility so that it can be wound around or unwound from the roller together with the display panel 120. For example, the back cover 110 may be made of a metal material such as steel use stainless (SUS) and Invar, or a material such as plastic. It is to be noted that the material of the back cover 110 may be changed as long as the material satisfies the physical property conditions such as the amount of thermal deformation, the radius of curvature and the strength depending on the design choice.

The back cover 110 may include a plurality of supporting areas PA and a plurality of flexible areas MA. In the plurality of supporting areas PA, no opening 111 is formed. In the plurality of flexible areas MA, a plurality of openings 111 is formed. Specifically, a first supporting area PA1, a first flexible area MA1, a second supporting area PA2, a second flexible area MA2, and a third supporting area PA3 may be disposed in this order from the top end of the back cover 110. It is, however, to be understood that the present disclosure is not limited thereto. Since the back cover 110 is wound or unwound in the column direction, the plurality of supporting areas PA and the plurality of flexible areas MA may be arranged along the column direction.

The first supporting area PA1 is the uppermost area of the back cover 110 and is fastened to the head bar 182. First fastening holes AH1 may be formed in the first supporting area PA1 for fastening to the head bar 182. For example, the head bar 182 may be fastened to the first supporting area PA1 of the back cover 110 through screws penetrating the head bar 182 and the first fastening holes AH1. As the first supporting area PA1 is fastened to the head bar 182, when the link units 181 fastened to the head bar 182 are elevated or lowered, the back cover 110 may also be elevated or lowered together. In addition, the display panel 120 attached to the back cover 110 may also be elevated or lowered together. Although the five first fastening holes AH1 are shown in FIG. 4, the number of the first fastening holes AH1 is not limited to five. In addition, although the back cover 110 is fastened to the head bar 182 using the first fastening holes AH1 in the example shown in FIG. 4, the present disclosure is not limited thereto. The back cover 110 and the head bar 182 may be fastened without a separate fastening hole.

The first flexible area MA1 is extended from the first supporting area PA1 toward the lower side of the back cover 110. In the first flexible area MA1, a plurality of openings 111 may be formed and the display panel 120 may be attached. Specifically, the first flexible area MA1 may be wound around or unwound from the roller 171 together with the display panel 120. The first flexible area MA1 may overlap at least the display panel 120 among the other elements of the display part DP.

In addition, the second supporting area PA2 is extended from the first flexible area MA1 toward the lower side of the back cover 110. In the second supporting area PA2, one end of the display panel 120 and at least one flexible film 130 connected to the end of the display panel 120 may be disposed. Although FIG. 4 shows an example where at least one flexible film 130 and the printed circuit board 135 are disposed on the upper surface of the second supporting area PA2, the present disclosure is not limited thereto. The printed circuit board 135 may be disposed on the rear surface of the back cover 110. In addition, the support bar 160 may be disposed on the surface of the display part DP that is opposite to the surface on which the second supporting area PA2 is disposed, i.e., the upper surface of the display panel 120, and may be fastened to the display part DP.

In order to protect the at least one flexible film 130 and the printed circuit board 135, the second supporting area PA2 may allow the at least one flexible film 130 and the printed circuit board 135 to remain flat without being bent over the roller 171.

In addition, when the second supporting area PA2 is wound around the roller 171, a portion of the outer circumferential surface of the roller 171 in contact with the second supporting area PA2 may also be made flat. Accordingly, the second supporting area PA2 may be wound around the roller 171 or may remain flat all the time irrespectively of whether the display device is unwound, and thus the at least one flexible film 130 and the printed circuit board 135 disposed in the second supporting area PA2 can remain flat.

In addition, the second flexible area MA2 is extended from the second supporting area PA2 toward the lower side of the back cover 110. In the second flexible area MA2, a plurality of openings 111 is formed. The second flexible area MA2 is extended so that the display area AA of the display panel 120 can be disposed outside the housing part HP. That is to say, for example, when the back cover 110 and the display panel 120 are fully unwound, the third supporting area MA3 of the back cover 110 fixed to the roller 171, the second flexible area MA2 and the second supporting area PA2 where the flexible film 130 and the printed circuit boards 135 are arranged may be located inside the housing part HP, whereas the first flexible area MA1 having the display panel 120 attached thereto may be located outside the housing part HP. In other words, when the display panel 120 is fully unwounded, the third supporting area PA3 fixed to the roller 171, the second flexible area MA2 and the second supporting area PA2 may be located inside the housing part HP.

If the length from the third supporting area PA3 to the second supporting area PA2 is smaller than the length from the third supporting area PA3 to the opening HPO of the housing part HP, a part of the first flexible area MA1 having the display panel 120 attached thereto may be located inside the housing part HP and accordingly a part of the lower end of the display area AA of the display panel 120 may be located inside the housing part HP. As a result, a part of images displayed on the display panel 120 may not be seen. Therefore, the display device may be designed so that the length from the third supporting area PA3 fixed to the roller 171 to the second supporting area PA2 is equal to the length from the third supporting area PA3 fixed to the roller 171 to the opening HPO of the housing part HP. However, it is merely illustrative.

In addition, the third supporting area PA3 is extended from the second flexible area MA2 toward the lower side of the back cover 110. The third supporting area PA3 is the lowermost area of the back cover 110 and is fastened to the roller 171. Second fastening holes AH2 may be formed in the third supporting area PA3 for fastening to the roller 171. For example, the screws penetrating the roller 171 and the second fastening holes AH2 are disposed, so that the roller 171 and the third supporting area A3 of the back cover 110 can be fastened. As the third supporting area PA3 is fastened to the roller 171, the back cover 110 may be wound around or unwound from the roller 171. Although the two second fastening holes AH2 are shown in FIG. 4, the number of the second fastening holes AH2 is not limited to two.

It is to be noted that the plurality of openings 111 formed in the plurality of flexible areas MA is not formed in the first supporting area PA1, the second supporting area PA2, and the third supporting area PA3. Specifically, the first fastening holes AH1 are formed in the first supporting area PA1 and the second fastening holes AH2 area formed in the third supporting area PA3, but the openings 111 like those formed in the flexible areas MA are not formed in the first supporting area PA1, the second supporting area PA2 and the third supporting area PA3. In addition, the first fastening holes AH1 and the second fastening holes AH2 have a different shape from the shape of the plurality of openings 111. The first supporting area PA1 may be fixed to the head bar 182. The second supporting area PA2 may support at least one flexible film 130 and the printed circuit board 135. The third supporting area PA3 may be fixed to the roller 171 and may be more rigid than the plurality of flexible areas MA.

As the first supporting area PA1, the second supporting area PA2 and the third supporting area PA3 have rigidity, the first supporting area PA1 and the third supporting area PA3 may be firmly fixed to the head bar 182 and the roller 171. In addition, the second supporting area PA2 keeps the at least one flexible film 130 and the printed circuit board 135 flat without being bent, so that the at least one flexible film 130 and the printed circuit board 135 can be protected. Therefore, the display part DP is fixed to the roller 171 and the head bar 182 of the driver MP, and thus it may move into or out of the housing part HP according to the operation of the driver MP, so that the at least one flexible film 130 and the printed circuit board 135 can be protected.

Although the plurality of supporting areas PA and the plurality of flexible areas MA of the back cover 110 are sequentially arranged along the column direction in the example shown in FIG. 4, the plurality of supporting areas PA and the plurality of flexible areas MA may be arranged along the row direction when the back cover 110 is wound in the row direction.

When the display part DP is wound or unwound, the openings 111 formed in the flexible areas MA of the back cover 110 may be deformed due to the stress applied to the display part DR Specifically, when the display part DP is wound or unwound, the flexible areas MA of the back cover 110 may be deformed as the openings 111 contract or expand. As the openings 111 contract or expand, it is possible to suppress the display panel 120 disposed on the flexible areas MA of the back cover 110 from slipping, and the stress applied to the display panel 120 can be reduced.

Incidentally, when the display panel 120 and the back cover 110 are wound, due to the difference in the radius of curvature between the display panel 120 and the back cover 110, there is a difference in the length between the display panel 120 and the back cover 110 which are wound around the roller 171. For example, the length of the back cover 110 when it is wound around the roller 171 once may be different from the length of the display panel 120 when it is wound around the roller 171 once. Specifically, since the display panel 120 is disposed more to the outside of the roller 171 than the back cover 110, for example, the length of the display panel 120 when it is wound around once the roller 171 may be larger than the length of the back cover 110 when it is wound around once the roller 171. As such, when the display part DP is wound, there is a difference in the length between the back cover 110 and the display panel 120 wound around the roller 151 due to the difference in the radius of curvature. As a result, the display panel 120 attached to the back cover 110 may slide and deviate from the original position. As used herein, a phenomenon that the display panel 120 slips from the back cover 110 due to a difference in the radius of curvature and stress caused by winding may be defined as a slip phenomenon. If the slip is excessively large, the display panel 120 may be detached from the back cover 110, or defects such as cracks may occur.

In the display device 100 according to an exemplary aspect of the present disclosure, even if stress is applied to the display part DP while the display part DP is wound or unwound, the plurality of openings 111 of the back cover 110 can be deformed flexibly so that the stress applied to the back cover 110 and the display panel 120 can be relieved. For example, when the back cover 110 and the display panel 120 are wound around the roller 171 in the column direction, stress may be applied which deforms the back cover 110 and the display panel 120 in the vertical direction. When this happens, the plurality of openings 111 of the back cover 110 may be expanded in the vertical direction of the back cover 110, and the length of the back cover 110 may be flexibly deformed. Accordingly, the difference in the length between the back cover 110 and the display panel 120 due to the difference in the radius of curvature in the course of winding the back cover 110 and the display panel 120 can be compensated for by the plurality of openings 111 of the back cover 110. In addition, the openings 111 are deformed when the back cover 110 and the display panel 120 are wound, so that stress applied from the back cover 110 to the display panel 120 can also be relieved.

Referring to FIGS. 4, 5A and 5B, the display panel 120 may be disposed on the upper surface of the back cover 110. For example, the display panel 120 may be disposed in the first flexible area MA1 on the upper surface of the back cover 110.

The display panel 120 is a panel for displaying images to a user. In the display panel 120, a display element for displaying images, a driving element for driving the display element, lines for transmitting various signals to the display element and the driving element, etc. may be disposed.

The display element may be defined differently depending on the type of the display panel 120. For example, in the case that the display panel 120 is the organic light-emitting display panel 120, the display device may be an organic light-emitting element including an anode, an organic emission layer, and a cathode. For example, when the display panel 120 is a liquid-crystal display panel, the display element may be a liquid-crystal display element. In the following description, the display panel 120 is described as an organic light-emitting display panel. It is, however, to be understood that the display panel 120 is not limited to the organic light-emitting display panel. As the display device 100 according to the exemplary aspect of the present disclosure is a rollable display device, the display panel 120 may be implemented as a flexible display panel in order to be wound around or unwound from the roller 171.

The display panel 120 may include a display area AA and a non-display area NA.

In the display area AA, images are displayed on the display panel 120. A plurality of sub-pixels SPX forming each of a plurality of pixels and driver circuits for driving the sub-pixels SPX may be disposed in the display area AA.

Each of the plurality of sub-pixels SPX is the minimum unit forming the display area AA. The display element may be disposed in each of the plurality of sub-pixels SPX. For example, an organic light-emitting element including an anode, an organic emission layer, and a cathode may be disposed in each of the plurality of sub pixels SPX. It is, however, to be understood that the present disclosure is not limited thereto. In addition, driving elements, lines etc. may be included in the driver circuits for driving the sub-pixels SPX. For example, the driver circuits may be formed of, but is not limited to, thin-film transistors, storage capacitors, gate lines, data lines, etc.

In the non-display area NA, no image is displayed. In the non-display area NA, a variety of lines and circuits for driving the organic light-emitting elements in the display area AA, etc. may be disposed. For example, in the non-display area NA, link lines for transmitting signals to the sub-pixels SPX and the driver circuits of the display area AA, or driver ICs 132 such as a gate driver and a data driver, at least flexible film 130, etc. may be disposed. It is, however, to be understood that the present disclosure is not limited thereto. A pad area may be located in the non-display area NA under the display panel 120.

As described above, at least one flexible film 130 may be disposed in the second supporting area PA2 of the back cover 110. The at least one flexible film 130 may be formed by disposing a variety of elements such as the driver ICs 132 on a flexible base film 131 so as to transmit signals to the sub-pixels SPX and the driver circuits in the display area AA. The at least one flexible film 130 may be electrically connected to the display panel 120.

One end of the at least one flexible film 130 may be disposed in the non-display area NA of the display panel 120 to supply the supply voltage, data voltage, etc. to the plurality of sub-pixels SPX and the driver circuits in the display area AA. Although five flexible films 130 are depicted in the example shown in FIGS. 5A and 5B, the number of the flexible films 130 is not limited to five but may vary depending on the design choice.

The driver ICs 132 such as the gate driver IC and the data driver IC may be disposed on the flexible films 130. The driver IC 132 is an element for processing data for displaying image and driving signals for processing the data. The driver ICs may be disposed by using the chip-on-glass (COG) technique, the chip-on-film (COF) technique, tape carrier package (TCP) technique, etc. Although the driver ICs are mounted on the flexible films 130 by using the chip-on-film (COF) technique for convenience of illustration, it is, however, to be understood that the present disclosure is not limited thereto.

The printed circuit board may be disposed on the rear surface of the second supporting area PA2 of the back cover 110 to be connected to the flexible films 130. The printed circuit board is an element that supplies signals to the driver ICs 132. On the printed circuit board, a variety of elements for supplying various signals such as driving signals and data signals to the driver ICs 132 may be disposed.

An additional printed circuit board connected to the printed circuit board may be further disposed. For example, the printed circuit board may be referred to as a source printed circuit board (S-PCB) on which the data driver is mounted, and the additional printed circuit board connected to the printed circuit board may be referred to as a control printed circuit board (C-PCB) on which the timing controller and the like are mounted. For example, the additional printed circuit board may be disposed inside the roller 171, may be disposed in the housing part HP outside the roller 171, or may be disposed in contact with the printed circuit board.

A fastening hole is located between the flexible films 130, so that a fastened means 165 such as a bolt may penetrate through the support bar 160, the display panel 120 and the back cover 110 to fasten them with one another.

As the fastening hole is located between the flexible films 130, it is possible to prevent interference between the lines.

The size of the fastening hole may be, for example, approximately 2.1 mm to 2.2 mm, which is equal to the diameter of laser drilling. It is, however, to be understood that the present disclosure is not limited thereto.

The non-display area NA may surround the display area AA, as shown in FIG. 4. It is, however, to be understood that the present disclosure is not limited thereto. The non-display area NA may be defined as an area extended from the display area AA.

Referring to FIGS. 6 and 7, the display device 100 according to an exemplary aspect of the present disclosure may include a substrate 121, a thin-film transistor 150, an organic light-emitting element 140, at least one flexible film 130, a protective layer 128, anti-crack layers 118a and 118b, a sealing layer 119, and a sealing substrate 125.

The substrate 121 is a base member for supporting various elements of the display panel 120 and may be made of an insulating material. The substrate 121 may be made of a material having flexibility to allow the display panel 120 to be wound or unwound. For example, the substrate 121 may be made of a plastic material such as polyimide (PI).

A buffer layer 122 may be disposed on the substrate 121. The buffer layer 122 prevents diffusion of moisture and/or oxygen that has permeated from the outside of the substrate 121. The buffer layer 122 may be made of an inorganic material, and may be made up of, for example, a single layer of silicon oxide (SiOx) or silicon nitride (SiNx) or multiple layers thereof. It is, however, to be understood that the present disclosure is not limited thereto.

A pixel portion 123 is disposed on the substrate 121 and the buffer layer 122. The pixel portion 123 may include a plurality of organic light-emitting elements 140 and circuits for driving the organic light-emitting elements 140. The pixel portion 123 may fall in the display area AA.

The display panel 120 may be either a top-emission display panel or a bottom-emission display panel depending on the direction in which light emitted from the organic light-emitting elements exits.

In the top-emission display panel, the light emitted from the organic light-emitting elements 140 exits toward the upper side of the substrate 121 where the organic light-emitting elements 140 are formed. When the display panel 120 is the top-emission display panel, a reflective layer may be formed under the anode 141 to propagate the light emitted from the organic light-emitting element toward the upper side of the substrate 121, i.e., the cathode 143.

In the bottom-emission display panel, the light emitted from the organic light-emitting elements 140 exits toward the lower side of the substrate 121 where the organic light-emitting elements 140 are formed. In the bottom-emission display panel, in order to propagate the light emitted from the organic light-emitting elements 140 toward the lower side of the substrate 121, the anode 141 may be made only of a transparent conductive material while the cathode 143 may be made of a metal material having high reflectivity.

In the following description, for convenience of illustration, the display device 100 is a bottom-emission display device. It is, however, to be understood that the present disclosure is not limited thereto.

In particular, referring to FIG. 6, the thin-film transistor 150 may be disposed on the substrate 121. The thin-film transistor 150 may work as a driving element of the display device 100.

The thin-film transistor 150 may include a gate electrode 151, an active layer 152, a source electrode 153, and a drain electrode 154. The thin-film transistor 150 shown in FIG. 6 has the bottom-gate structure in which the active layer 152 is disposed on the gate electrode 151, the source electrode 153 and the drain electrode 154 are disposed on the active layer 152, i.e., the gate electrode 151 is disposed at the bottom. It is, however, to be understood that the present disclosure is not limited thereto.

The gate electrode 151 of the thin-film transistor 150 is disposed above the substrate 121. The gate electrode 151 may be formed of, but is not limited to, one selected from among a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

A gate insulating layer 115a may be disposed on the gate electrode 151. The gate insulating layer 115a may be made of an insulating material in order to electrically insulate between the gate electrode 151 and the active layer 152. The gate insulating layer 115a may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto.

The active layer 152 is disposed on the gate insulating layer 115a. The active layer 152 may be disposed to overlap the gate electrode 151. For example, the active layer 152 may be formed of an oxide semiconductor or may be formed of an amorphous silicon (a-Si), a polycrystalline silicon (poly-Si), or an organic semiconductor, or the like.

The source electrode 153 and the drain electrode 154 are disposed on the active layer 152. The source electrode 153 and the drain electrode 154 may be disposed on the same layer and may be spaced apart from each other. The source electrode 153 and the drain electrode 154 may be electrically connected to the active layer 152 by being in contact with the active layer 152. It is, however, to be understood that the present disclosure is not limited thereto. The source electrode 153 and the drain electrode 154 may be formed of, but is not limited to, one selected from among a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

In some exemplary aspects, an etch stopper may be disposed between the active layer 152 and the source electrode 153 and between the active layer 152 and the drain electrode 154 above the active layer 152. If the etch stopper is formed by patterning the source electrode 153 and the drain electrode 154, a back channel of the active layer 152 may be formed in order to prevent damage due to plasma.

A planarization layer 115b may be disposed over the thin-film transistor 150.

The planarization layer 115b can protect the thin-film transistor 150 and can provide a flat surface over the layers disposed on the substrate 121 which have different levels. The planarization layer 115b may be formed of, but is not limited to, one of acrylic resin, epoxy resin, phenol resin, polyamide resin, polyimide resin, unsaturated polyester resin, polyphenylene resin, polyphenylene sulfide resin, benzocyclobutene and photoresist.

The organic light-emitting element 140 may be disposed on the planarization layer 115b. The organic light-emitting element 140 is a self-luminous element and may be driven by the thin-film transistor 150 disposed in the sub-pixel SPX. The organic light-emitting element 140 may include an anode 141, an organic emission layer 142 on the anode 141, and a cathode 143 on the organic emission layer 142.

The anode 141 may be disposed on the planarization layer 115b in each of the sub-pixels SPX. The anode 141 may be electrically connected to the drain electrode 154 of the thin-film transistor 150 through a contact hole formed in the planarization layer 115b. Although FIG. 6 shows that the anode 141 is electrically connected to the drain electrode 154 of the thin-film transistor 150, the anode 141 is electrically connected to the source electrode 153 of the thin-film transistor 150 depending on the type of the thin-film transistor 150.

The anode 141 is made of a conductive material capable of supplying holes to the organic emission layer 142. When the display device 100 is of the bottom-emission type, the anode 141 may be implemented as a transparent conductive layer made of a conductive material having a high work function. For example, the anode 141 may be made of, but is not limited to, a transparent conductive oxide such as indium tin oxide (ITO), indium zinc oxide (IZO), indium tin zinc oxide (ITZO), zinc oxide (ZnO) and tin oxide (TO).

A bank 115c may be disposed over the anode 141 and the planarization layer 115b.

The bank 115c is an insulating layer for separating adjacent sub-pixels SPX one from another. The bank 115c may be formed to open a part of the anode 141. For example, the bank 115c may be made of an organic insulating material formed to cover the edge of the anode 141, and may be made of polyimide, acrylic, or benzocyclobutene (BCB)-based resin. It is, however, to be understood that the present disclosure is not limited thereto.

The organic emission layer 142 is a layer for emitting light of a particular color and may be one of a red light-emitting layer, a green light-emitting layer, a blue light-emitting layer and a white light-emitting layer. The organic emission layer 142 may be disposed between the anode 141 and the cathode 143. The organic emission layer 142 may be made up of a single light-emitting layer or a stack of multiple layers that emit light of different colors. In addition to the organic emission layer 142, organic layers such as a hole injection layer, a hole transport layer, an electron transport layer and an electron injection layer may be further included. Referring to FIG. 6, the organic emission layer 142 may be disposed above the front surface of the substrate 121 and the organic emission layer 142 disposed in one of the sub-pixels SPX may be connected to the organic emission layer disposed in the adjacent ones of the sub-pixels SPX. However, all or a part of the organic emission layer 142 may be separately disposed in each of the sub-pixels SPX.

The cathode 143 may be disposed on the organic emission layer 142. The cathode 143 may be made of a conductive material to supply electrons to the organic emission layer 142. Since the display device 100 is of a bottom-emission type, the cathode 143 may be made of a metal material such as silver (Ag), copper (Cu), and magnesium-silver alloy (Mg:Ag).

Referring to FIG. 7, a plurality of first pads P1 may be disposed in the non-display area NA. The first pads P1 are conductive elements for transmitting various signals from the flexible film 130 to the display part DP and the driver.

The first pads P1 may transmit various signals such as a data signal, a high-level voltage, a low-level voltage and a clock signal through lines. Although the first pads P1 are formed on the buffer layer 122 in the example shown in FIG. 7, the present disclosure is not limited thereto. The first pads P1 may be formed on a variety of insulating layers that may be disposed in the non-display area NA, e.g., on an inorganic insulating layer.

The flexible film 130 may be disposed in the non-display area NA of the substrate 121. The flexible film 130 is formed by disposing a variety of elements such as the driver ICs 132 on a flexible base film 131. The flexible film 130 is a film for supplying signals to the sub-pixels SPX and the circuits in the display area AA, and a second pad P2 of the flexible film 130 may be electrically connected to the first pad P1 disposed on the substrate 121. The flexible film 130 may be disposed at one end of the non-display area NA to supply a data signal, a high-level voltage, a low-level voltage, a clock signal, etc. to the plurality of sub-pixels SPX and the circuits in the display area AA.

A conductive adhesive layer 117 may be disposed between the substrate 121 and the flexible film 130. The conductive adhesive layer 117 may fix the substrate 121 to the flexible film 130 and may electrically connect the first pad P1 on the substrate 121 with the second pad P2 of the flexible film 130. The conductive adhesive layer 117 may be formed by dispersing conductive particles in an adhesive material, for example, and may be formed as an anisotropic conductive film (ACF). The substrate 121 and the flexible film 130 may be fixed by the adhesive material of the conductive adhesive layer 117, and the first pad P1 and the second pad P2 may be electrically connected with each other through an electrical path formed by the conductive particles.

The protective layer 128 may be disposed in the non-display area NA of the substrate 121. It is, however, to be understood that the present disclosure is not limited thereto. The protective layer may be eliminated.

The protective layer 128 may be disposed to surround the display area AA in the non-display area NA and may be disposed to surround the first adhesive layer AD1. Thus, the protective layer 128 may be formed in, but is not limited to, a square ring shape when viewed from the top. The outer edge of the protective layer 128 may be disposed on substantially the same line as the outer edge of the substrate 121. Accordingly, the protective layer 128 may be disposed to cover a part of the flexible film 130 in the non-display area NA.

The protective layer 128 may be disposed over an inorganic insulating layer such as the buffer layer 122, the flexible film 130 and the conductive adhesive layer 117 in the non-display area NA. In addition, the protective layer 128 may be in contact with the buffer layer 122, the flexible film 130 and the conductive adhesive layer 117 and may provide a flat surface over them. Accordingly, the protective layer 128 may allow the sealing layer 119 formed on the protective layer 128 to be formed on the flat surface.

Referring to FIG. 7, the anti-crack layers 118a and 118b may be disposed at one end of the non-display area NA of the substrate 121. The anti-crack layers 118a and 118b can prevent crack damages due to laser drilling when the fastening holes H for fastening the support bar 160 are formed.

The anti-crack layers 118a and 118b may be disposed at the end of the non-display area NA of the substrate 121 to which the support bar 160 is fastened. The anti-crack layers 118a and 118b may include a first anti-crack layer 118a disposed under the substrate 121 and a second anti-crack layer 118b disposed on the protective layer 128. For example, the first anti-crack layer 118a may be in contact with a side surface of the barrier film 126, and the second anti-crack layer 118b may be in contact with a side surface of the encapsulation substrate 125. It is, however, to be understood that the present disclosure is not limited thereto. The second anti-crack layer 118b may be disposed above an inorganic insulating layer, such as the buffer layer 122, the flexible film 130 and the conductive adhesive layer 117 in the non-display area NA in place of the protective layer 128 respectively.

The anti-crack layers 118a and 118b may be disposed under and/or on the polyimide-based display panel 120. The thickness of the anti-crack layers 118a and 118b is not particularly limited as long as it is less than the thickness of the polarizing plate 127 and the encapsulation substrate 125.

The anti-crack layers 118a and 118b may be made of, for example, tetraethyl orthosilicate (TEOS), acryl, sodium silicate (Na2SiO3), or epoxy-based materials.

In addition, the anti-crack layers 118a and 118b may be disposed to surround the display area AA in the non-display area NA.

The sealing layer 119 may be disposed above the protective layer 128 and the second anti-crack layer 118b in the non-display area NA of the substrate 121. The sealing layer 119 is formed in order to prevent moisture permeation through the side portions of the display device 100 and reduce defects during subsequent processes. The sealing layer 119 may be made of a UV curable material, for example, UV-curable material added with a UV-curable oligomer such as epoxy acrylate, urethane acrylate, polyester acrylate, urethane and silicone acrylate. It is, however, to be understood that the present disclosure is not limited thereto.

The sealing layer 119 may be disposed to surround the display area AA in the non-display area NA and may be disposed to surround the encapsulation substrate 125. As shown in FIG. 7, the sealing layer 119 may be disposed to surround the side surfaces of the encapsulation substrate 125 in the non-display area NA. Thus, the sealing layer 119 may be formed in, but is not limited to, a square ring shape when viewed from the top.

In a typical organic light-emitting display device, only a sealing layer is formed to cover a substrate and a flexible film in order to prevent moisture permeation through the side portions of the organic light-emitting display device and reducing defects during subsequent processes. That is to say, the sealing layer is formed to be in direct contact with the flexible substrate. Since the sealing layer is formed by being coated, e.g., by printing and cured and is made of a material having a low viscosity, it is relatively vulnerable to moisture permeation. In addition, since only the sealing layer is disposed on the side portions of the organic light-emitting display device, there is a problem of moisture permeation through the side portions of the organic light-emitting display device. To overcome this, it may be contemplated to add a moisture absorbent to the sealing layer. Unfortunately, it is not possible to add the moisture absorbent because the sealing layer must be transparent to allow alignment keys disposed under the sealing layer to be seen during a subsequent process.

In this regard, in the display device 100 according to an exemplary aspect of the present disclosure, multiple layers of the protective layer 128, the second anti-crack layer 118b and the sealing layer 119 are disposed on the side portions of the display device 100, thereby preventing moisture permeation through the side portions of the display device 100. Specifically, the protective layer 128 made of a ceramic material, the second anti-crack layer 118b made of an organic material and the sealing layer 119 are sequentially formed on the substrate 121, and thus three layers are disposed on the side portions of the display device 100. Therefore, it is possible to prevent more effectively the moisture permeation than when only the sealing layer 119 is formed. In this manner, the display device 100 according to the exemplary aspect of the present disclosure can more effectively block moisture permeation through the side portions and can improve the reliability.

Incidentally, in a typical process of fabricating an organic light-emitting display device, a flexible film is fixed on a substrate by using a conductive adhesive layer and then a sealing layer is formed thereon. In doing so, an inorganic insulating layer such as a buffer layer, a conductive adhesive layer, and a flexible film are disposed on the surface of the substrate before forming the sealing layer. Since the buffer layer, the conductive adhesive layer and the flexible film are made of different materials, the surface characteristics of the upper surfaces of the buffer layer, conductive adhesive layer and flexible film on which the sealing layer is coated are also different from one another. In addition, since the upper surfaces of the buffer layer, the conductive adhesive layer and the flexible film have different heights, there are level differences between the upper surfaces of the buffer layer, the conductive adhesive layer and the flexible film on which the sealing layer is coated. As a result, the sealing layer may not be coated well during the forming process, and accordingly, a process defect may occur during the process of fabricating the sealing layer. In particular, in a region in which the flexible film is formed, roughness is not good, and holes or bubbles may occur in the sealing layer.

In this regard, in the display device 100 according to the exemplary aspect of the present disclosure, the protective layer 128 that provides at the flat surface under the sealing layer 119 and the second anti-crack layer 118b are disposed, so that the sealing layer 119 can be coated more reliably during the forming process and process defects can be prevented. That is to say, the protective layer 128 covering the upper surfaces of the buffer layer 122, the conductive adhesive layer 117 and the flexible film 130 provide the flat upper surface, and the second anti-crack layer 118b and the sealing layer 119 are sequentially formed on the protective layer 128. Accordingly, the sealing layer 119 is formed on the flat upper surface of the second anti-crack layer 118b and in contact with the upper surface of the second anti-crack layer 118b. Therefore, in the display device 100 according to an exemplary aspect of the present disclosure, the sealing layer 119 is formed on the single second anti-crack layer 118b having the same surface characteristics, and the upper surface of the second anti-crack layer 118b is flat, so that the sealing layer 119 can be formed more reliably during the forming process and defects can be prevented during the process of fabricating the sealing layer 119 or a subsequent process.

Incidentally, in the display device 100 according to the exemplary aspect of the present disclosure, the support bar 160 may be fastened to the rear surface of the display panel 120 of the non-display area NA in which the flexible film 130 is disposed.

A tape 116 may be further disposed between the support bar 160 and the polarizing plate 127. The tape 116 may be made of polyimide and can prevent the polarizing plate 127 from cracking during laser drilling.

The tape 116 may be replaced with the first anti-crack layer 118a.

As the support bar 160 and the display part DP are fastened to each other through the fastening holes H by the fastening means, it is possible to reduce the shift phenomenon between the display panel 120 and the mechanism.

For a typical rollable display device, cracks generated while the display device is rolled may cause defects in driving of the display panel. Specifically, when the display device is rolled, stress is applied to the flexible film due to cracking of the polyimide substrate and the gap with the mechanism of the printed circuit board, thereby causing damage to the flexible film and cracking of the pad area. In addition, when the display panel is not fixed to the mechanism, the shift phenomenon of the display panel may occur during the rolling. This may result in failure in driving of the display panel and reliability issues of the display panel.

In view of the above, in the display device 100 according to the exemplary aspect of the present disclosure, the shift phenomenon between the display panel 120 and the mechanism, e.g., the roller 117 can be reduced, and the stress applied to the flexible film 130 can be suppressed.

To this end, when the pad area of the display panel 120 is flat, the support bar 160 is disposed on the upper surface at the lower end of the display panel 120, and the fastening holes H are formed in the support bar 160, the display panel 120 and the back cover 110 via a laser drilling process. Then, they can be fixed together by fastening them with fastening means such as bolts and screws. In addition, it is possible to reduce the stress on the pad area during the rolling by forming anti-shift means on the rear surface of the back cover 110 and fixing it to the fastening groove formed in the roller 171. In this manner, according to the exemplary aspect of the present disclosure, it is possible to reduce cracks in the pad area and damage to the flexible film which may occur in the rollable display device 100 employing a polyimide substrate. A more detailed description thereon will be given below with reference to FIGS. 8 to 11.

Referring to FIGS. 6 and 7, an encapsulation layer 124 may be disposed to cover the pixel portion 123.

The encapsulation layer 124 seals the organic light-emitting element 140 of the pixel portion 123.

The encapsulation layer 124 can protect the organic light-emitting element 140 of the pixel portion 123 from the outside moisture, oxygen, impact, etc. The encapsulation layer 124 may be formed by alternately stacking a plurality of inorganic layers and a plurality of organic layers. For example, the inorganic layers may be made of an inorganic material such as silicon nitride (SiNx), silicon oxide (SiOx) and aluminum oxide (AlOx). The organic layer may be made of an epoxy-based or acrylic-based polymer. It is, however, to be understood that the present disclosure is not limited thereto.

The encapsulation substrate 125 may be disposed on the encapsulation layer 124.

For example, the encapsulation substrate 125 may be disposed between the encapsulation layer 124 and the back cover 110. The encapsulation substrate 125 can protect the organic light-emitting element 140 of the pixel portion 123 together with the encapsulation layer 124.

The encapsulation substrate 125 can protect the organic light-emitting element 140 of the pixel portion 123 from the outside moisture, oxygen, impact, etc. For example, the encapsulation substrate 125 may be made of a material having a high modulus of approximately 200 MPa to 900 MPa.

The encapsulation substrate 125 may be made of a metal material such as aluminum (Al), nickel (Ni), chromium (Cr), an alloy of iron (Fe) and nickel, etc., which is resistant to corrosion and is easy to be processed into a foil or thin film. As the encapsulation substrate 125 is made of such a metal material, the ultra-thin encapsulation substrate 125 can be implemented, which is resistant to the outside impact, scratches.

The first adhesive layer AD1 may be disposed between the encapsulation layer 124 and the encapsulation substrate 125. The first adhesive layer AD1 may attach the encapsulation layer 124 to the encapsulation substrate 125 together. The first adhesive layer AD1 may be made of a material having adhesive properties, and may be a thermally-curable or naturally-curable adhesive. For example, the first adhesive layer AD1 may be made of, but is not limited to, an optical clear adhesive (OCA), a pressure sensitive adhesive (PSA), etc.

The first adhesive layer AD1 may be disposed to surround the encapsulation layer 124 and the pixel portion 123. Specifically, the pixel portion 123 may be sealed by the buffer layer 122 and the encapsulation layer 124, and the encapsulation layer 124 and the pixel portion 123 may be sealed by the buffer layer 122 and the first adhesive layer AD1. The first adhesive layer AD1 can protect the organic light-emitting element of the pixel portion 123 from moisture, oxygen, and impact from outside, along with the encapsulation layer 124 and the encapsulation substrate 125. To this end, the first adhesive layer AD1 may further include a hygroscopic agent. The hygroscopic agent may be hygroscopic particles and can absorb moisture and oxygen from the outside, thereby suppressing the permeation of moisture and oxygen into the pixel portion 123.

A second adhesive layer AD2 may be disposed between the encapsulation substrate 125 and the back cover 110. The second adhesive layer AD2 may attach the encapsulation substrate 125 to the back cover 110. The second adhesive layer AD2 may be made of a material having adhesive properties, and may be a thermally-curable or naturally-curable adhesive. For example, the second adhesive layer AD2 may be made of, but is not limited to, an optical clear adhesive (OCA), a pressure sensitive adhesive (PSA), etc.

Although the openings 111 of the back cover 110 are not filled with the second adhesive layer AD2 in the example shown in FIG. 7, the openings 111 of the back cover 110 may be partially or entirely filled with the second adhesive layer AD2. If the inner sides of the openings 111 of the back cover 110 are filled with the second adhesive layer AD2, the contact area between the second adhesive layer AD2 and the back cover 110 is increased, so that it is possible to prevent the separation between the second adhesive layer AD2 and the back cover 110.

The barrier film 126 and the polarizing plate 127 may be disposed on the rear surface of the display panel 120. The polarizing plate 127 selectively transmits light to reduce reflection of external light incident on the display panel 120. Specifically, the display panel 120 may include a variety of metal materials applied to semiconductor elements, lines, organic light-emitting elements, etc. Accordingly, external light incident on the display panel 120 may be reflected off such a metal material, and thus visibility of the display device 100 may be deteriorated due to the reflection of the external light. In this regard, by disposing the polarizing plate 127, it is possible to prevent the reflection of the external light to increase the outdoor visibility of the display device 100. In some implementations, however, the polarizing plate 127 may be eliminated.

An adhesive layer may be disposed on one surface of the polarizing plate 127. It is, however, to be understood that the present disclosure is not limited thereto.

Depending on the design of the display device 100, the polarizing plate 127 may be eliminated or another optical member may be added.

Hereinafter, a fixing structure of the display panel 120 will be described in detail with reference to FIGS. 8 to 11.

Figure 8:
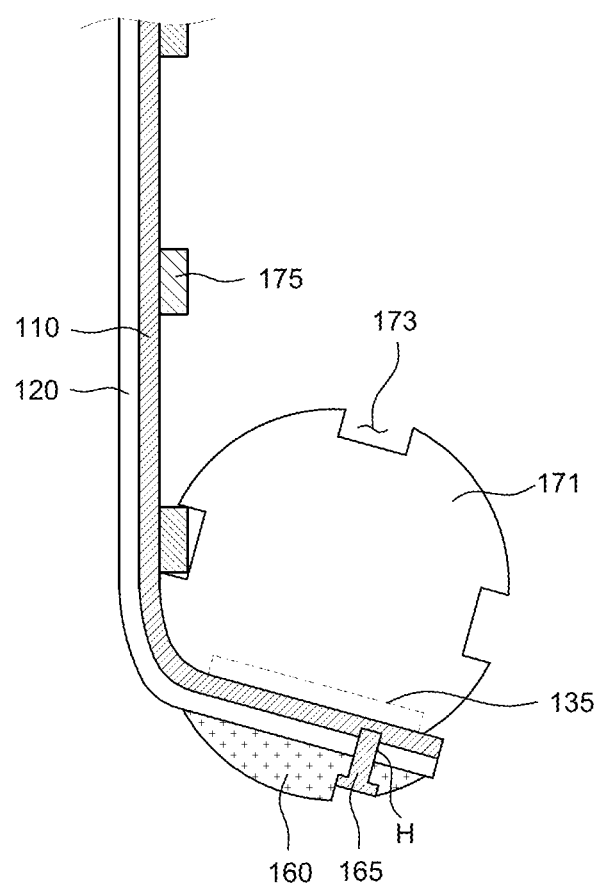
FIG. 8 is a cross-sectional view showing a display part fastened to a roller in a display device according to an exemplary aspect of the present disclosure.

FIG. 8 is a cross-sectional view showing a display part fastened to a roller in a display device according to an exemplary aspect of the present disclosure.

Figure 9:
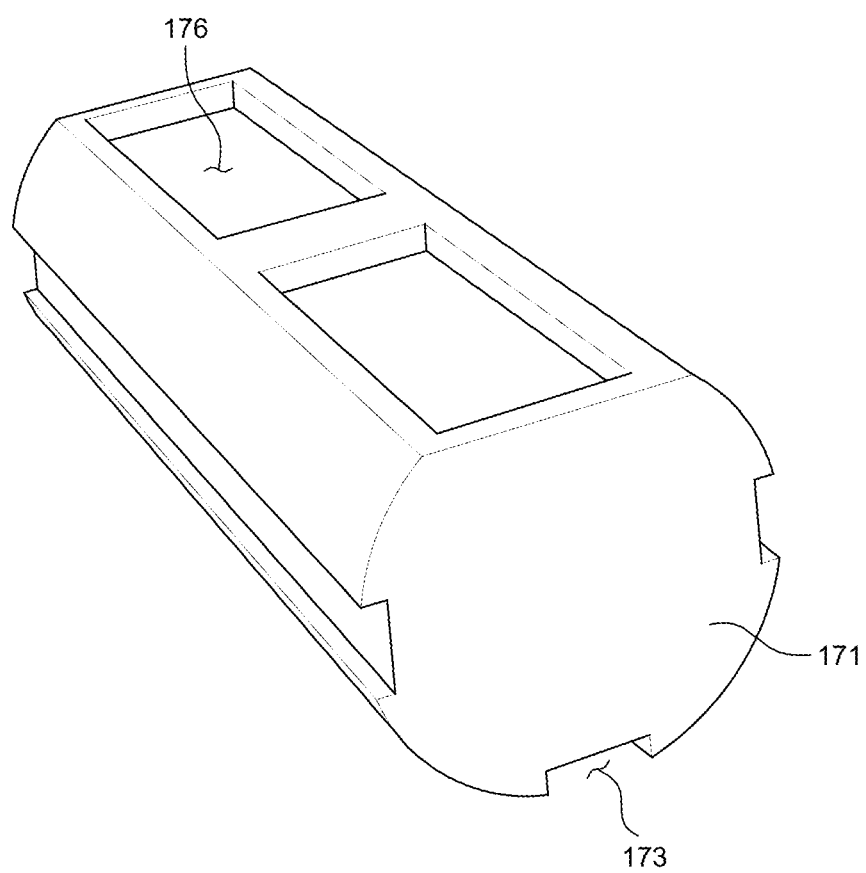
FIG. 9 is a perspective view showing a roller according to an exemplary aspect of the present disclosure.

FIG. 9 is a perspective view showing a roller according to an exemplary aspect of the present disclosure.

Figure 10:
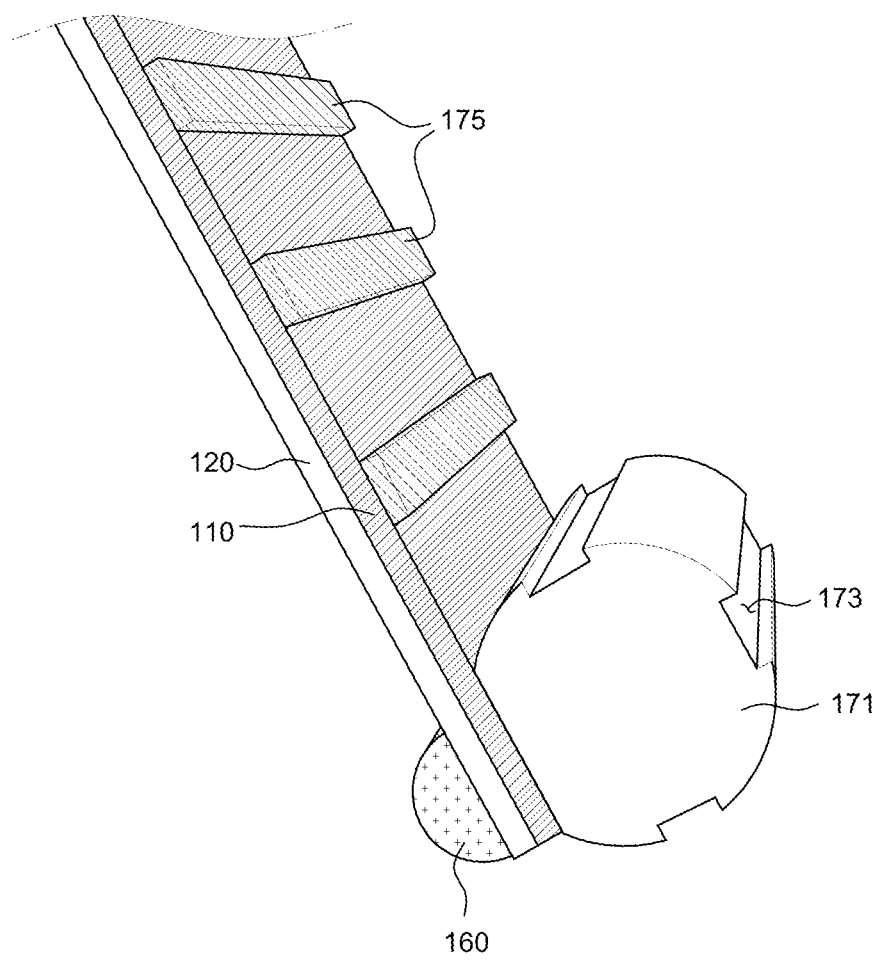
FIG. 10 is a perspective view showing a display part fastened to a roller in a display device according to an exemplary aspect of the present disclosure.

FIG. 10 is a perspective view showing a display part fastened to a roller in a display device according to an exemplary aspect of the present disclosure.

Figure 11:
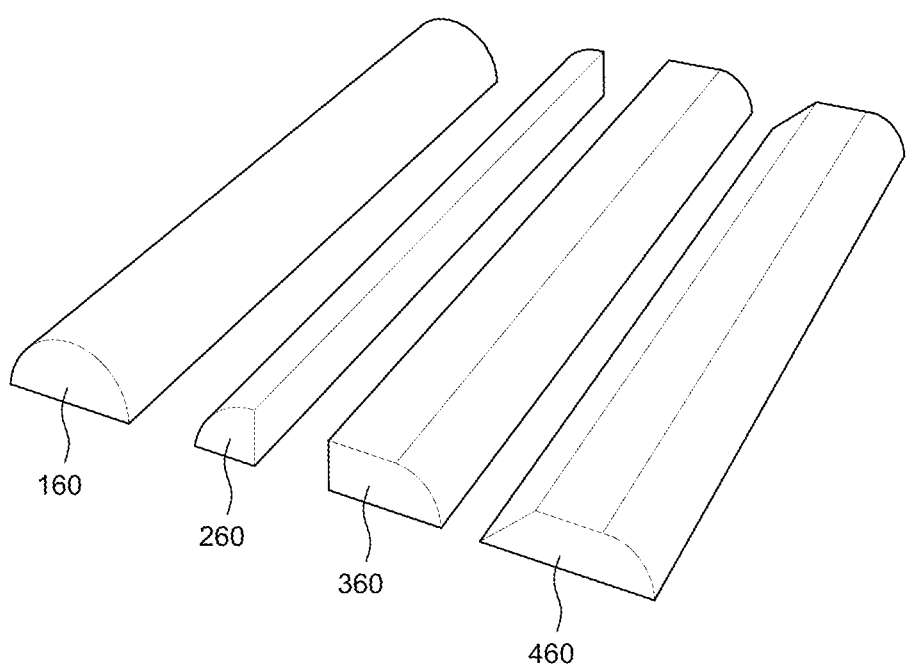
FIG. 11 is a perspective view showing examples of the shape of a support bar according to an exemplary aspect of the present disclosure.

FIG. 11 is a perspective view showing examples of the shape of a support bar according to an exemplary aspect of the present disclosure.

Referring to FIGS. 8 to 11, the display part DP may include the back cover 110, the display panel 120, at least one flexible film, and printed circuit board 135. The flexible film is not depicted in FIGS. 8 and 10 for convenience of illustration.

According to an exemplary aspect of the present disclosure, the back cover 110 may be disposed on the rear surface of the display panel 120 to support the display panel 120, the flexible film and the printed circuit board 135. The back cover 110 may be larger than the display panel 120. The back cover 110 can protect other elements of the display part DP from the outside.

The printed circuit board 135 may be disposed anywhere on the rear surface or upper surface of the back cover 110.

Although the back cover 110 is made of a material having rigidity, at least a part of the back cover 110 may have flexibility so that it can be wound around or unwound from the roller together with the display panel 120. For example, the back cover 110 may be made of a metal material such as steel use stainless (SUS) and Invar, or a material such as plastic. It is to be noted that the material of the back cover 110 may be changed as long as the material satisfies the physical property conditions such as the amount of thermal deformation, the radius of curvature and the strength depending on the design choice.

The back cover 110 may include a plurality of supporting areas and a plurality of flexible areas. The plurality of supporting areas includes no opening, whereas the plurality of flexible areas includes a plurality of openings.

At least one flexible film may be disposed in the supporting areas of the back cover 110. The at least one flexible film 130 may be formed by disposing a variety of elements on a flexible base film so as to transmit signals to the sub-pixels and the driver circuits in the display area. The at least one flexible film 130 may be electrically connected to the display panel 120. As described above, one end of the at least one flexible film may be disposed in the non-display area of the display panel 120 to supply the supply voltage, the data voltage, etc. to the plurality of sub-pixels and the driver circuits in the display area. The number of the flexible films is not limited herein and may vary depending on the design choice.

The printed circuit board 135 may be disposed on the rear surface of the supporting areas of the back cover 110 to be connected to the at least one flexible film. The printed circuit board 135 is an element for supplying signals to the driver ICs. On the printed circuit board, a variety of elements for supplying various signals such as driving signals and data signals to the driver ICs may be disposed. The number of the printed circuit boards 135 is not limited herein and may vary depending on the design choice.

The roller 171 is a member around which the display part DP is wound. The roller 171 may be formed in a cylindrical shape, for example. The lower edge of the display part DP may be fixed to the roller 171. When the roller 171 rotates, the display part DP having its lower edge fixed to the roller 171 may be wound around the roller 171. When the roller 171 rotates in the opposite direction, the display part DP wound around the roller 171 may be unwound from the roller 171.

The roller 171 may be formed in a cylindrical shape. A part of the outer circumferential surface of the cylindrical shape may be formed as a flat surface, and the rest part of the outer circumferential surface of the cylindrical shape may be formed as a curved surface. That is to say, the roller 171 may be formed generally in a cylindrical shape, with a part of it formed as a flat surface.

The printed circuit board 135 of the display part DP may be seated on the flat surface of the roller 171. It is, however, to be noted that the roller 171 may be formed in a complete cylindrical shape or in any shape as long as the display part DP can be wound around it.

The roller 171 may be made of, but is not limited to, a metal material such as aluminum, nickel alloy and stainless steel.

The printed circuit board 135 may be mounted in a flat part of the roller 171. Specifically, at least one accommodating groove 176 is formed inside the flat part of the roller 171, so that the printed circuit board 135 of the display part DP may be inserted into and seated in the accommodating groove 176. The number of the accommodating grooves 176 may be equal to the number of the printed circuit board 135.

Although two accommodating grooves 176 are shown in the example shown in FIG. 9, the present disclosure is not limited thereto.

The accommodating groove 176 may have a shape conforming to the shape of the printed circuit board 135.

The support bar 160 according to the exemplary aspect of the present disclosure may be fastened to the opposite surface to the surface of the display part DP where the flat part of the roller 171 is in contact with and fastened to. That is to say, while the flat part of the roller 171 is in contact with the rear surface of the back cover 110 and the bottom surface of the support bar 160 is in contact with the upper surface of the display panel 120, the support bar 160, the display panel 120 and the back cover 110 may be fastened and fixed to one another.

For more reliable fixing, the fastening means 165 may be fastened to the roller 171 as well as the support bar 160, the display panel 120 and the back cover 110.

As the support bar 160, silicon, polyvinyl chloride (PVC), acrylic, polypropylene, aluminum, or nickel alloy may be used.

In addition, according to the exemplary aspect of the present disclosure, the outer circumferential surface of the shape of the support bar 160 may form an arc while the bottom surface (or bottom) thereof may form a flat surface to conform to the flat part of the roller 171. The convex support bar 160 may form a generally circular shape together with the curved part of the roller 171 in cross section.

Referring to FIG. 11, the support bars 160, 260, 360 and 460 may have a width of 20 mm to 60 mm depending on the width of the pad area of the display panel 120.

The support bars 160, 260, 360 and 460 may have a streamlined shape such as a semi-circle, an arc and a trapezoid, or a combination of these shapes.

In addition, according to an exemplary aspect of the present disclosure, a plurality of anti-shift means 175 may be formed on the rear surface of the back cover 110, as shown in FIGS. 8 and 10.

The anti-shift means 175 may have a generally rectangular column shape and may be attached to the rear surface of the back cover 110.

A plurality of fastening grooves 173 may be formed in the curved part of the roller 171 in correspondence to the plurality of anti-shift means 175. When the display part DP is rolled, the anti-shift means 175 are fixed to the fastening grooves 173 of the roller 171, respectively, so that it is possible to reduce stress on the pad area.

Silicone, PVC, acryl, polypropylene, aluminum, a nickel alloy, etc. may be used as the anti-shift means 175.

The exemplary aspects of the present disclosure can also be described as follows:

According to an aspect of the present disclosure, there is provided a display device. The display device includes a display panel, a back cover disposed on a rear surface of the display panel to support the display panel, a roller disposed on a rear surface of the back cover, wherein the display panel and the back cover are wound around or unwound from the roller, a support bar disposed on a front surface of the display panel and fastened to the display panel and the back cover through fastening means and at least one anti-shift means disposed on the rear surface of the back cover and fastened to a fastening groove of the roller when the display panel and the back cover are wound around the roller.

The display device may further include at least one flexible film electrically connected to an end of the display panel and disposed on a surface of the back cover and a printed circuit board electrically connected to the at least one flexible film and disposed on another surface of the back cover.

The roller may have a cylindrical shape comprising an outer peripheral surface consisting of a flat part and a curved part, and wherein the printed circuit board may be disposed on the flat part of the roller.

The display device may further include an accommodating groove formed inside the flat part of the roller, wherein the printed circuit board may be inserted and seated into the accommodating groove.

The support bar may have an outer circumferential surface forming an arc and a bottom forming a flat surface, and may be disposed on a front surface of the display panel that is opposite to the back cover.

A cross section of the support bar and the curved part of the roller together may form a circular shape.

The cross section of the support bar may have a semi-circular shape, an arc shape, a trapezoidal shape, or a combination of the shapes.

The fastening groove may be formed in the curved part of the roller.

The display panel may further comprise a substrate divided into a display area and a non-display area, and wherein the display device may further comprise a protective layer disposed on the substrate in the non-display area.

The display device may further include a first anti-crack layer disposed under the substrate in the non-display area.

The display device may further include a barrier film disposed on a side surface of the first anti-crack layer.

The display device may further include a polarizing plate disposed on the first anti-crack layer and the barrier film.

The display device may further include a support bar disposed on the polarizing plate.

The display device may further include a tape interposed between the support bar and the polarizing plate, wherein the tape may be made of polyimide.

The display device may further include a second anti-crack layer disposed above the substrate in the non-display area.

The second anti-crack layer may be disposed on the protective layer.

The display device may further include a sealing layer disposed on the protective layer and/or the second anti-crack layer.

The display device may further include a fastening hole penetrating the support bar, the tape, the polarizing plate, the substrate, the protective layer, the first and second anti-crack layers, the sealing layer and a part of the back cover, wherein the fastening means may fasten the support bar, the display panel and the back cover to one another through the fastening hole.

According to another aspect of the present disclosure, there is provided a display device. The display device includes a display panel, a back cover disposed on a rear surface of the display panel to support the display panel, a roller disposed on a rear surface of the back cover, wherein the display panel and the back cover may be wound around or unwound from the roller and a support bar disposed on a front surface of the display panel and fastened to the display panel and the back cover through fastening means, wherein the display panel may comprise a substrate divided into a display area and a non-display area, a first anti-crack layer disposed below the substrate in the non-display area and a second anti-crack layer disposed above the substrate in the non-display area, and wherein the support bar may be disposed over the first anti-crack layer.

The roller may have a cylindrical shape comprising an outer peripheral surface consisting of a flat part and a curved part, and wherein the support bar may be disposed on the flat part of the roller.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
    a display panel;
    a back cover disposed on a rear surface of the display panel and supporting the display panel;
    a roller disposed on a rear surface of the back cover, wherein the display panel and the back cover are wound around or unwound from the roller;
    a support bar disposed on a front surface of the display panel and fastened to the display panel and the back cover through fastening means; and
    at least one anti-shifter disposed on the rear surface of the back cover and fastened to a fastening groove of the roller when the display panel and the back cover are wound around the roller.

2. The display device of claim 1, further comprising:
    at least one flexible film electrically connected to an end of the display panel and disposed on a surface of the back cover; and
    a printed circuit board electrically connected to the at least one flexible film and disposed on another surface of the back cover.

3. The display device of claim 2, wherein the roller has a cylindrical shape having an outer peripheral surface with a flat part and a curved part, and
    wherein the printed circuit board is disposed on the flat part of the roller.

4. The display device of claim 3, further comprising an accommodating groove formed inside the flat part of the roller,
    wherein the printed circuit board is inserted and seated into the accommodating groove.

5. The display device of claim 1, wherein the support bar has an outer circumferential surface forming an arc and a bottom forming a flat surface, and is disposed on a front surface of the display panel that is opposite to the back cover.

6. The display device of claim 3, wherein a cross-section of the support bar and the curved part of the roller together form a circular shape.

7. The display device of claim 6, wherein the cross section of the support bar has a semi-circular shape, an arc shape, a trapezoidal shape, or a combination of thereof.

8. The display device of claim 3, wherein the fastening groove is formed in the curved part of the roller.

9. The display device of claim 1, wherein the display panel further comprises a substrate divided into a display area and a non-display area, and wherein the display device further comprises a protective layer disposed on the substrate in the non-display area.

10. The display device of claim 9, further comprising a first anti-crack layer disposed under the substrate in the non-display area.

11. The display device of claim 10, further comprising a barrier film disposed on a side surface of the first anti-crack layer.

12. The display device of claim 11, further comprising a polarizing plate disposed on the first anti-crack layer and the barrier film.

13. The display device of claim 12, further comprising the support bar disposed on the polarizing plate.

14. The display device of claim 12, further comprising a tape interposed between the support bar and the polarizing plate and made of polyimide.

15. The display device of claim 12, further comprising a second anti-crack layer disposed above the substrate in the non-display area.

16. The display device of claim 15, wherein the second anti-crack layer is disposed on the protective layer.

17. The display device of claim 15, further comprising a sealing layer disposed on the protective layer and/or the second anti-crack layer.

18. The display device of claim 17, further comprising a fastening hole penetrating the support bar, the tape, the polarizing plate, the substrate, the protective layer, the first and second anti-crack layers, the sealing layer and a part of the back cover, wherein the fastener fastens the support bar, the display panel and the back cover to one another through the fastening hole.

19. A display device comprising:
a display panel;
a back cover disposed on a rear surface of the display panel to support the display panel;
a roller disposed on a rear surface of the back cover, wherein the display panel and the back cover are wound around or unwound from the roller; and
a support bar disposed on a front surface of the display panel and fastened to the display panel and the back cover through fastener,
wherein the display panel comprises:
a substrate divided into a display area and a non-display area;
a first anti-crack layer disposed below the substrate in the non-display area; and
a second anti-crack layer disposed above the substrate in the non-display area, and
wherein the support bar is disposed over the first anti-crack layer.

20. The display device of claim 19, wherein the roller has a cylindrical shape comprising an outer peripheral surface consisting of a flat part and a curved part, and wherein the support bar is disposed on the flat part of the roller.

* * * * *